United States Patent [19]
Satoh et al.

[11] Patent Number: 5,432,676
[45] Date of Patent: Jul. 11, 1995

[54] ELECTRONIC APPARATUS CASE WITH WIRING MEMBER EMBEDDED IN A MOLDED PLASTIC HINGE

[75] Inventors: Hideaki Satoh, Kanagawa; Sakae Itakura, Ayase; Kenichi Waragai, Fujisawa, all of Japan

[73] Assignee: Hitachi, Ltd., Tokyo, Japan

[21] Appl. No.: 29,042

[22] Filed: Mar. 9, 1993

[30] Foreign Application Priority Data

Mar. 12, 1992 [JP] Japan ................... 4-053307

[51] Int. Cl.⁶ .................. H05K 5/03; H05K 5/06; B65D 43/18; E05D 1/00
[52] U.S. Cl. .................. 361/752; 16/223; 16/225; 220/339; 174/52.1; 174/52.2; 425/588; 425/573; 264/328.8; 361/739; 361/755; 361/757
[58] Field of Search ............... 16/223, 225, 227, 385, 16/DIG. 13; 264/328.8; 425/573, 588; 220/339, DIG. 11, DIG. 12, DIG. 14; 235/1 D, 145 R:146; 174/52.1, 52.2; 364/708.1; 361/679, 728, 736, 739, 752, 755, 757

[56] References Cited

U.S. PATENT DOCUMENTS 3,838,213  9/1974  Georgopulos et al. ........ 174/52.1 X
4,703,160 10/1987  Narishima et al. ................. 235/1 D
4,769,199  9/1988  Bemis et al. .................... 264/145 X

FOREIGN PATENT DOCUMENTS 59-78687  5/1984  Japan .
1210857 11/1970  United Kingdom ................. 16/225

Primary Examiner—Michael W. Phillips
Attorney, Agent, or Firm—Antonelli, Terry, Stout & Kraus

[57] ABSTRACT

A case for housing an electronic apparatus has two main portions and a hinge portion which connects the main portions so as to be opened and closed. The case is formed of plastic molding. The hinge portion is formed of a soft resin having a resiliency, and the main portion is formed of a hard resin and integral with the hinge portion. A wiring member for provide an electric connection between the main portions extend through the hinge portion. The wiring member passes at a center of rotation on which the hinge portion is turned.

6 Claims, 5 Drawing Sheets

ELECTRONIC APPARATUS CASE WITH WIRING MEMBER EMBEDDED IN A MOLDED PLASTIC HINGE

BACKGROUND OF THE INVENTION

FIELD OF THE INVENTION

This invention relates to a book-type case housing an electronic apparatus, with the case formed of two parts capable of opening and closing through a hinge and, more particularly, to an electronic apparatus case integrally formed by plastic molding, and a method and a mold for molding the case.

DESCRIPTION OF THE RELATED ART

As is well known, book-type cases for housing electronic apparatuses have a structure formed of a hinge portion and a pair of independent frames placed on the opposite sides of the hinge portion. The hinge portion and the frames correspond to the backbone and the front and back covers of a book, respectively. A pair of conventional independent openable frames of this kind have the respective supporting shafts to which gears meshing with each other are fixed. The frames are connected to each other through a connection member surrounding the gears, and can be operated on the motion of the gears to be opened or closed. Wiring circuit boards or the like on which electronic circuits are formed are mounted in the openable frames, and are electrically connected to each other through a wiring member in the form of a flexible printed circuit board. This wiring member is laid on the outside of the axis on which the openable frames are rotated relative to each other to open or close, and wiring member accommodation spaces are therefore formed in the openable frames to smoothly absorb the increase in the length of a surplus part of the wiring member when the case is opened. Also, the connection member and outer portions of the openable frames are always overlapped with each other such that the wiring member cannot seen from the outside. Japanese Utility Model Unexamined Publication No. 59-78687 discloses a structure relating to this kind of art.

The above-described conventional construction requires two independent openable frames, a connection member, gears for forming an opening/closing mechanism, supporting shaft for supporting the gears and other components, and then requires many processes for working a large number of component parts. Also, the openable frames having gears and the connection member, which connects the openable frames while covering the wiring member in the form of a flexible printed circuit board, must be assembled while a surplus length of the wiring member is considered. These components cannot be assembled in a simple two-dimensional manner, and need to be assembled by a three-dimensional assembly process having many process steps.

Also, there is a strong possibility of a number of parts being damaged, and a problem concerning the reliability of the parts is encountered. There is also a limitation upon reducing the size of the apparatus. In particular, with respect to the accommodation of the wiring member, there is a strong risk of an electrical failure due to sliding of the wiring member on inner surfaces of the frames during repeated operations of opening and closing the frames, and spaces for absorbing the increase in the length of a surplus part of the wiring member are required in the frames.

Furthermore, portable apparatuses are required to have a water proof and dustproof structure because they are frequently used outdoors. If a plurality of independent component parts are combined to form the case of such apparatuses as described above, it is necessary to seal gaps between component parts exposed to the outside by using packings or the like. However, this is very difficult to achieve, and this problem has not been considered.

Moreover, since gears or belts are used in the hinge structure for opening/closing the operable frames, a user must open or close the case manually to set the case in a predetermined position. Therefore, it may be troublesome to perform such an operation for the conventional structure in the case of using an apparatus having a fixed open angle, e.g., a portable telephone set.

OBJECT AND SUMMARY OF THE INVENTION

In view of these problems, an object of the present invention is to provide a case for an electronic apparatus in which the number of component parts is small and which can be manufactured by a small number of processing steps.

Another object of the present invention is to provide a case for an electronic apparatus having a waterproof and dustproof structure and capable of opening automatically to a predetermined position.

Still another object of the present invention is to provide a low-cost case for an electronic apparatus having improved mechanical and electrical reliabilities.

A further object of the present invention is to provide a method of manufacturing such a case for an electronic apparatus in a simple manner.

Still a further object of the present invention is to provide a mold for practicing this method.

According to one aspect of the present invention, there is provided a case for housing an electronic apparatus, formed by plastic molding, which comprises a hinge portion formed of a soft resin having a resiliency, and two main portions each formed of a hard resin and integrally extending from the hinge portion.

According to another aspect of the present invention, there is provided a method of molding a case for housing an electronic apparatus, with the case including two main portions and a hinge portion which connects the main portions so as to be opened and closed. A mold including a stationary mold part having a core portion for forming the hinge portion is prepared, with two cavities being provided on the opposite sides of the core portion adjacent to the same to form the main portions. A first injection port injects a first resin to form the main portion, with the first injection port being placed adjacent to the cavities for forming the main portions, and a second injection port injects a second resin to form the hinge portion. A movable mold part includes core portions for forming the two main portions, with first runners for leading the first resin to the cavities in the stationary mold part, first gates connected to the first runners, and a cavity for forming the hinge portion. A second runner leads the second resin to the cavity for forming the hinge portion, with a second gate being connected to the second runner. Means support either a wiring member or a spacer in the cavity for forming the hinge portion, and either the wiring member or the spacer is fixed at a predetermined position in the cavity for forming the hinge portion in the movable mold part.

The movable mold part and the stationary mold part are brought into registry with each other and then the mold parts are clamped together. The first resin is supplied through the first injection port and the second resin is supplied through the second injection port so that the first and second resins flow into the two cavities for forming the main portions and the cavity for forming the hinge portion, respectively, in the same direction by flowing through the runners and gates to fill the cavities.

According to still another aspect of the present invention, there is provided a mold for injection-molding a case for housing an electronic apparatus, with the case including two main portions and a hinge portion which connects the main portions so as to be opened and closed. The mold comprises a stationary mold part having a core portion for forming the hinge portion, with two cavities provided on the opposite sides of the core portion adjacent to the same to form the main portions, a first injection port through which a first resin is to be injected to form the main portions, the first injection port being placed adjacent to the cavities for forming the main portions, and a second injection port through which a second resin is to be injected to form the hinge portion. A movable mold part includes core portions for forming the two main portions, first runners for leading the first resin to the cavities in the stationary mold part, first gates connected to the first runners, a cavity for forming the hinge portion, a second runner for leading the second resin to the cavity in the movable mold part, a second gate connected to the second runner, and means for supporting either a wiring member on a spacer in the cavity in the movable mold part.

Preferably, at the time of injection molding, the first and second resins are caused to flow in the same direction along a longitudinal direction of the hinge portion so as to simultaneously pass the boundaries between the main portions and the hinge portion. Boundary regions between the main portions and the hinge portion are thereby formed of a resin having an intermediate characteristic so as to extend generally straight.

Preferably, the sizes of the runners and the gates of the mold are adjusted so that the resins injected through the injection ports simultaneously pass the boundaries between the main portions and the hinge portion by flowing along the longitudinal direction of the hinge portion after flowing through the runners and the gates. By doing so, generally straight boundary regions are formed of a resin having an intermediate characteristic between the main portions and the hinge portion.

When the hinge portion and the main portions are integrally molded, the hinge portion is formed of a soft resin having a certain flexibility and resiliency, while the main portions are formed of a hard resin having a certain rigidity. It is desirable to select polymers in the same family as base polymers suitable for the resins forming the hinge portion and the main portions. It is preferable to select, as these resins, a combination of resins, e.g., copolymers, such as polyurethane, which are easy to control the hardness by modifying or changing, for example, the molecular weight or an atomic group of one of organic radicals constituting the copolymers. However, the base polymers may be selected from the polymers in different families.

The electronic apparatus case in accordance with the present invention is integrally formed of two hard resin parts which are bonded through a soft resin by one molding step and can therefore be handled as one part. It is therefore possible to reduce the number of working steps in the process of manufacturing this case and to eliminate the need for complicated assembly operations. Since the hinge portion is formed of a resilient soft resin in which one or a plurality of wiring members, e.g., a printed circuit board are embedded, there is no need for complicated parts, such as gears or parts of a rotation mechanism. Since each wiring member passes at a center of rotation on which the hinge portion is turned, it does not slide on inner surfaces of the main portions and there is no need to consider any surplus length, and improved mechanical and electrical reliabilities can be ensured. The need for spaces for absorbing a surplus length can be eliminated and the limitation upon reducing the overall size of the apparatus due to the existence of mechanical parts such as gears. It is therefore possible to increase the packaging density and to reduce the size of the apparatus. It is also possible to achieve, at the time of molding, the object of providing a waterproof and dustproof structure around the hinge portion, because the hinge portion is formed integrally with the main portions.

The main portions, which may be maintained in a closed state by a lock means, can be opened, when unlocked, by a resilient force of the hinge portion, i.e., a force which acts to restore the shape of the hinge portion in an open state determined at the time of molding, without receiving any external force.

DESCRIPTION OF THE PREFERRED EMBODIMENTS

Figure 1:
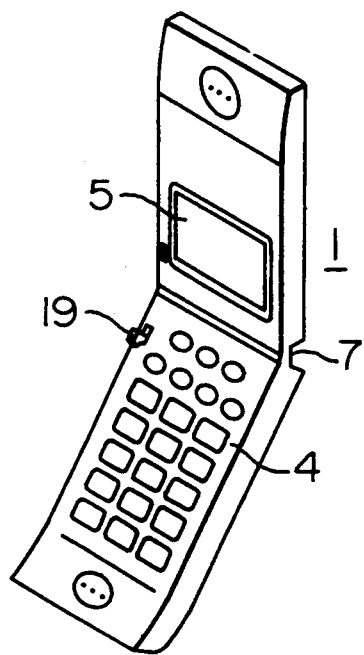
FIG. 1 is a perspective view of an example of an application of an openable case in accordance with the present invention to a portable telephone set.
Figure 2:
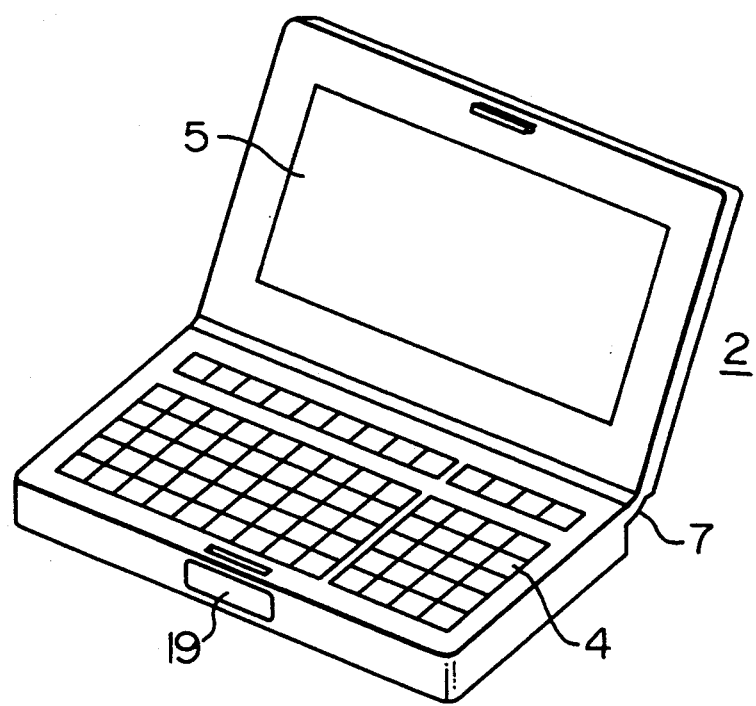
FIG. 2 is a perspective view of an example of an application of an openable case in accordance with the present invention to a portable personal computer.
Figure 3:
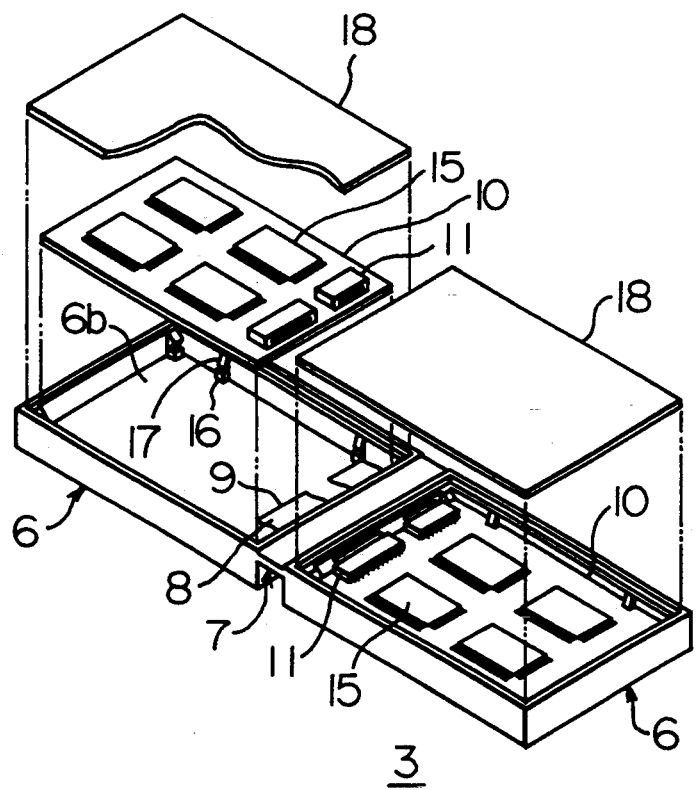
FIG. 3 is a partially exploded perspective view of an openable case in accordance with one embodiment of the present invention.

Ideally speaking, the use of electronic apparatuses, such as a portable telephone set 1 and a portable personal computer 2, respectively illustrated in FIGS. 1 and 2, is not limited with respect to place and time. The electronic apparatuses 1, 2 can be used anytime and anywhere. Accordingly, in designing these apparatuses 1, 2, a stress is put upon the portability, and reinforcement means for protection against shocks caused by falling during use and means for waterproofing at the time of outdoor use are required. Although an increase in packaging density, a reduction in size and improvements in functional qualities may be achieved by taking these requirements into consideration, there are limitations upon reducing the size of each of operating members 4, such as switch keys, and a display unit 5, such a liquid crystal display while maintaining the desired handling performance. To minimize the size of each electronic apparatus so that the apparatus can be conveniently compact out kept when not used and to enable the operating members 4 and the display unit 5 to be laid out over sufficiently large areas when the apparatus is used, a structure is adopted in which each electronic apparatus is sectioned into two main portions which are connected to be opened and closed through the hinge portion 7. The electronic apparatus is folded when not used, and it is opened when used. By this arrangement, the above-mentioned problems concerning the portability and handling can be solved.

A case for housing an electronic apparatus 3 in accordance with the present invention, whereby an increase in the packaging density, a reduction in the overall size of the apparatus and improvements in the functional qualities of the apparatus as described above can be achieved, will be described below with reference to FIGS. 3 to 6.

Openable frames 6 respectively forming main portions of the case are placed on the opposite sides of a hinge portion 7, each frame 6 being formed of a plastic by molding so as to have a box-like shape, and with the hinge portion 7 an oblong opening and closing the case. The openable frames 6 and the hinge portion 7 are integrally formed of resins in the same family, e.g., polyurethane resins, capable of setting hardnesses in a wide range from a semi-hard value to a soft value. The openable frames 6 are formed of a hard polyurethane resin 6a, and the hinge portion 7 is formed of a resilient soft polyurethane resin 7a. At the boundary between each openable frame 6 and the hinge portion 7, these resins having different hardnesses are fused together into a resin 7b having an intermediate hardness.

Figure 4:
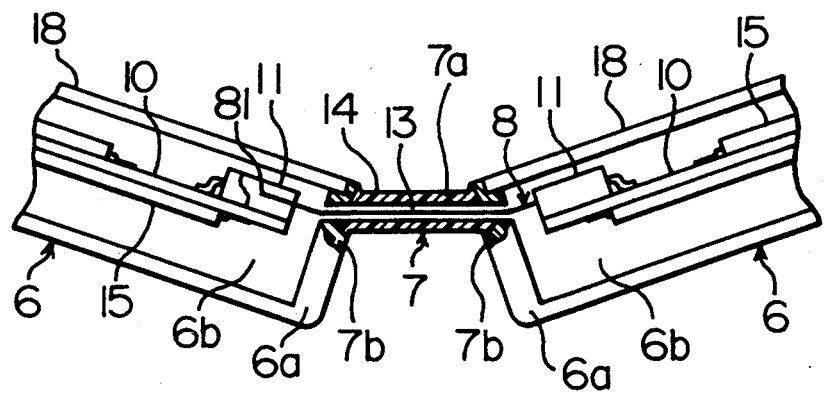
FIG. 4 is a fragmentary sectional side view of a hinge portion when the openable case is open.
Figure 5:
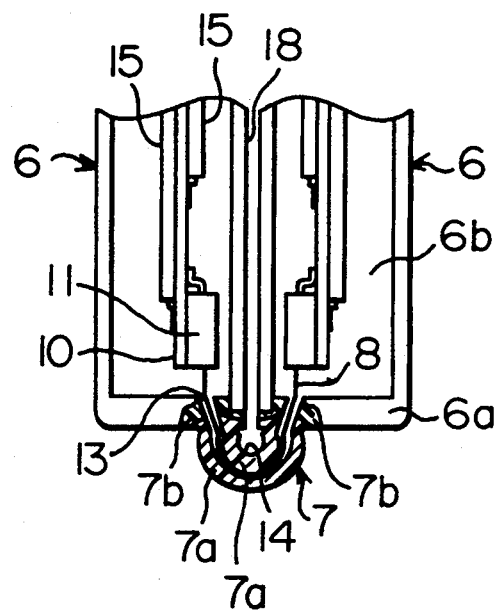
FIG. 5 is a fragmentary sectional side view of the hinge portion when the openable case is closed.

The two openable frames 6 are formed in an open state corresponding to a state of the electronic apparatus 3 when it is used. After completion of assembly of the apparatus, the two openable frames 6 can be closed or opened by being turned on the hinge portion 7 formed of the resilient soft resin 7a (FIG. 4). Furthermore, wiring members 8 mainly formed of, for example, a flexible polyimide thermosetting resin and each constructed in the form of a flexible printed circuit board, are embedded in the hinge portion 7 generally at the center thereof at the time of molding. Opposite end portions 9 (FIG. 3) of each wiring member 8 are exposed in cavities 6b of the openable frames 6 and are connected to connecters 11 mounted on printed circuit boards 10 set in the cavities 6b.

The temperature at which the above-described resins are set by reaction when molded is about 100° C. There is no risk of the wiring member 8 being damaged by heating at a temperature not higher than this temperature. Thus, the two frame members 6 and the hinge portion 7 may be molded by one molding step with the wiring member 8 embedded in the hinge portion 7.

Figure 6:
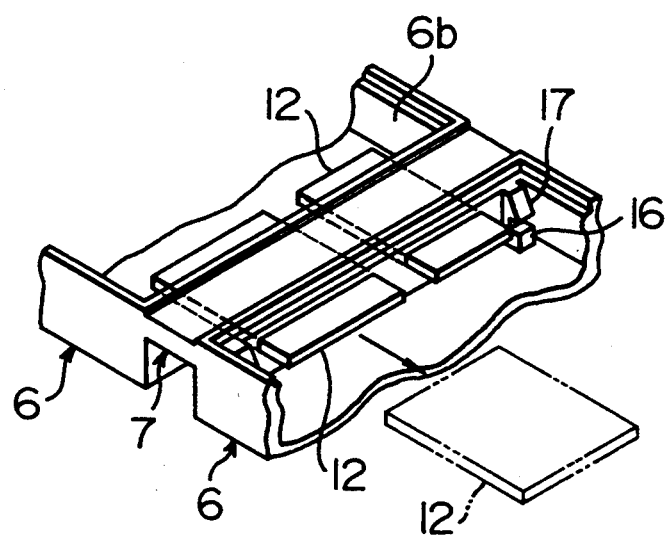
FIG. 6 is a fragmentary perspective view of a hinge portion in accordance with another embodiment of the present invention.

If the problem of damage to the wiring member 8 by the heat at the time of molding is serious in the case of embedding the wiring member 8 in the hinge portion 7, the wiring member 8 may be provided in a manner described below. The frames 6 and the hinge portion 7 are molded while spacers or flat metallic plates 12 are disposed so as to extend through the hinge portion 7 generally at the center thereof, as shown in FIG. 6. Thereafter, the metallic plates 12 are extracted and removed to form through holes 13, and the wiring members 8 are inserted into the through holes 13 (FIG. 4). The through holes 13 may be formed as spaces for absorbing the volume of a portion of an inner portion 14 of the hinge portion 7 (FIG. 5) when the openable frames 6 are closed.

In an assembly process after the molding, the printed circuit boards 10 on which the connectors 11 for electrical connection of the wiring members 8 and electronic parts 15 including large-scale integrated circuits are mounted are inserted in the cavities 6b of the openable frames 6. The printed circuit boards 10 are fixed in the cavity 6b of the openable frames 6 by fixing bosses 16 and fixing lugs 17, both formed integrally with the openable frames 6, provided at inner portions 6a of the cavities, and the ends 9 of the wiring members 8 are inserted into and connected to the connector 11. Further, a top cover 18 (FIG. 3) is fixed on each openable frame 6, for example, by an adhesive to close the cavity 6b in a watertight manner. The cases of the portable telephone set 1 and the personal computer 2 are formed so as to have predetermined opening angles, as shown in FIGS. 1 and 2. Each case can be maintained in a closed state by a closing lock 19. The closing lock 19 is released to allow the case to be opened and set in the predetermined open position by a resilience force of the resilient hinge portion 7, which acts to restore the shape of the hinge portion 7 in the open state determined at the time of molding. The case can be opened by this force without any external force. The resilient force of the hinge portion 7 is selected as desired according to the weight and other factors of the electronic apparatus 3 and the thickness, length and flexibility and other factors of the hinge portion 7. Since no mechanical stopper is used with the hinge portion 7, the hinge portion 7 can follow in compliance with an external force which is inadvertently applied to further open the case from the predetermined open position, and there is substantially no risk of the hinge portion 7 being damaged in such a situation. In such a situation, if the external force is removed, the case can be automatically restored to the normal open position again.

Referring to FIGS. 7 to 10, the following description will be made to a process of integrally manufacturing a pair of box-like openable frames 6 and a hinge portion 7 which is located generally at the center of the openable frames 6, on which the openable frames 6 are turned to be opened, and in which a wiring member 8 constructed in the form of a flexible printed circuit board is embedded.

(1) Mold Arrangement

Figure 7:
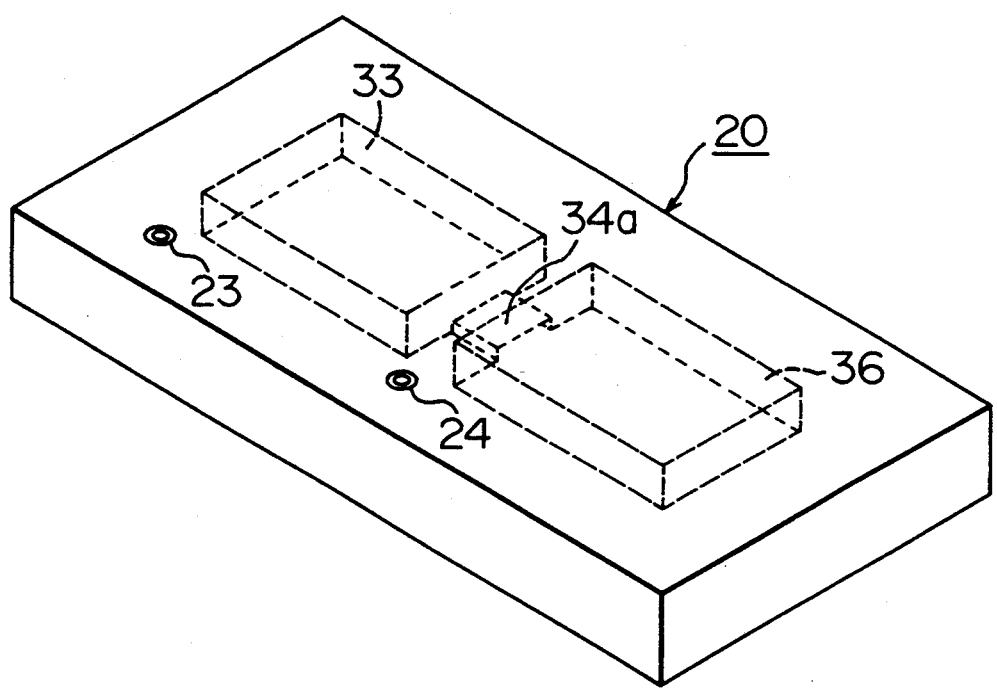
FIG. 7 is a perspective view of a stationary mold part of a mold for injection molding in accordance with an embodiment of the present invention.

A stationary mold part 20 has cavities 33 and 36 for forming the openable frames 6, a core portion 34a for forming the hinge portion 7, an injection port 23 through which a first resin for forming the frames 6 is to be injected, and an injection port 24 through which a second resin for forming the hinge portion 7 is to be injected (FIG. 7).

Figure 8:
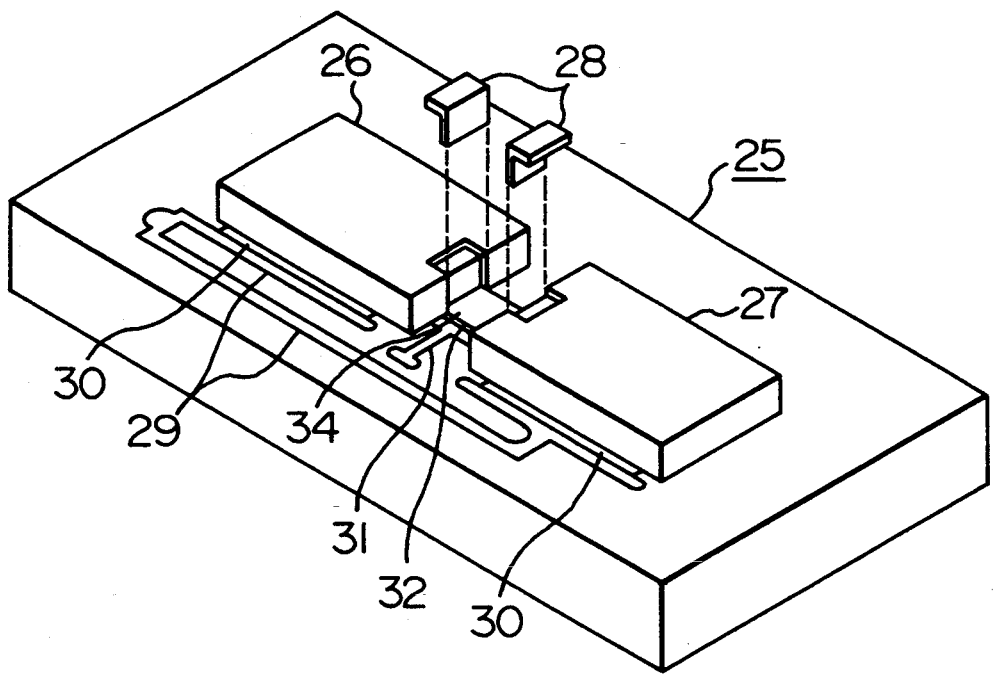
FIG. 8 is a perspective view of movable mold part mating with the mold part shown in FIG. 7.

A movable mold part 25 has core portions 26 and 27 for forming the openable frames 6, a cavity 34 for forming the hinge portion 7, runners 29 and gates 30 for leading the first resin for forming the frames to the cavities 33 and 36, and a runner 31 and a gate 32 for leading the second resin for forming the hinge portion 7 to the hinge cavity 34 (FIG. 8). Covers 28 for fixing the wiring member 8 to be embedded in the hinge portion 7 in a predetermined position are also provided on the movable mold part 25. Spacers 28a (FIG. 10) may be disposed in the cavity 34 separately of the covers 28, if necessary.

Table 1 shows examples of the combination of the first and second resins injection-molded to integrally form the frames 6 and the hinge portion 7 and the wiring member 8 used in accordance with this embodiment. If the temperatures at which the resins are melted to integrally mold the frames 6 and the hinge portion 7 are excessively high, a metallic lead frame may be used as the wiring member 8 embedded in the hinge portion.

TABLE 1

| ITEM | CHARACTERISTIC | EXAMPLES OF COMBINATION OF RESINS | | | |
|---|---|---|---|---|---|
| | | RESINS IN THE SAME FAMILY | | | DIFFERENT RESINS |
| FRAME 6 (FIRST RESIN) | RIGID | HARD POLYURETHANE | HARD POLYESTER ELASTOMER | HARD POLYAMIDE ELASTOMER | ABS RESIN |
| HINGE PORTION 7 (SECOND RESIN) | SOFT | SOFT POLYURETHANE | SOFT POLYESTER ELASTOMER | SOFT POLYAMIDE ELASTOMER | SOFT POLYESTER ELASTOMER |
| WIRING MEMBER 8 | SOFT | FLEXIBLE PRINTED CIRCUIT BOARD | METALLIC LEAD FRAME WIRING BOARD | ← | ← |
| BOUNDARY BETWEEN FRAME 6 AND HINGE PORTION 7 | | FUSION-BONDING BETWEEN FRAME 6 HINGE PORTION 7 | | | |

(2) Injection Molding Method

Figure 9:
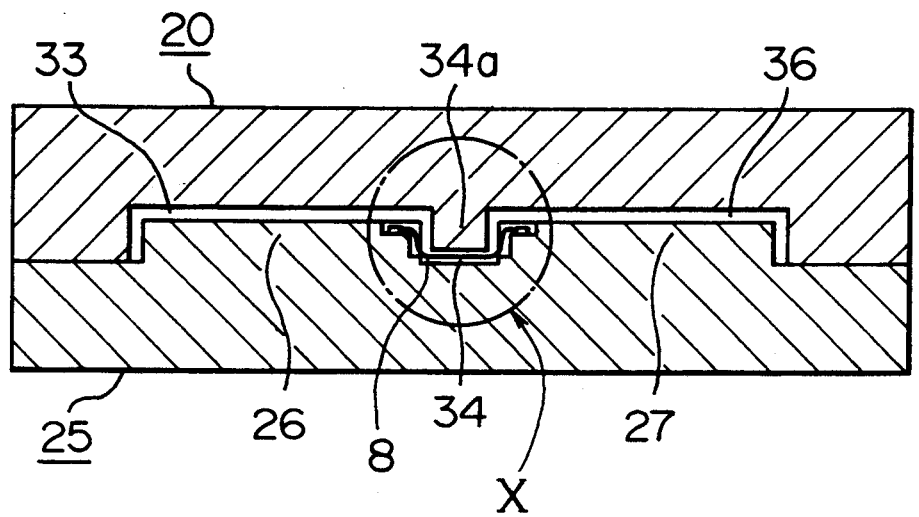
FIG. 9 is a cross-sectional view of the mold when the stationary and movable mold parts are clamped together.
Figure 10:
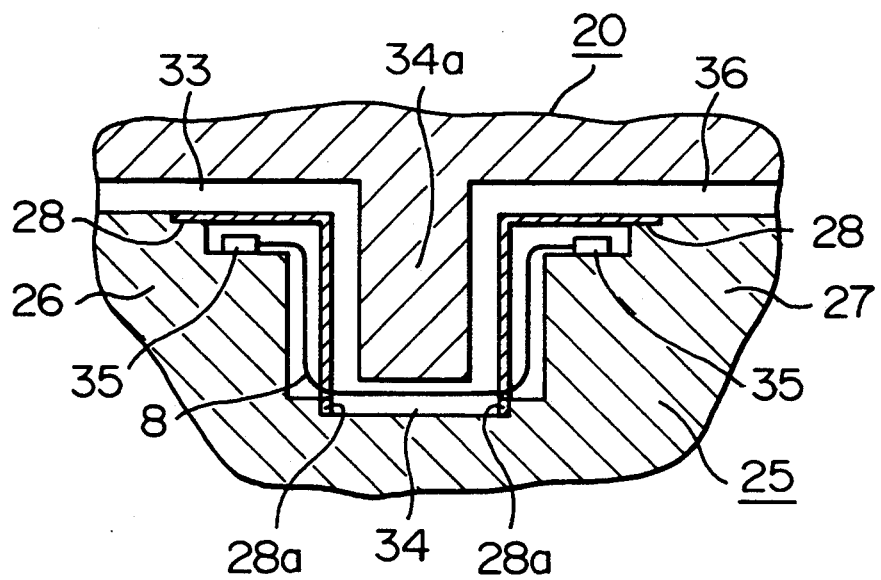
FIG. 10 is a fragmentary enlarged sectional view of a portion X shown in FIG. 9.

The pair of openable frames 6 and the hinge portion 7 which is located generally at the center of the openable frames 6, on which the openable frames 6 are turned to be opened, and in which the wiring member 8 is embedded are simultaneously molded integrally with each other, as described below. First, as shown in FIGS. 9 and 10, the wiring member 8 with the connectors connected to its opposite ends are positioned and fixed in the hinge cavity 34. Thereafter, the covers 28 are attached to the core portions 26 and 27 of the movable mold part 25 so that the wiring member 8 is positioned at the center of the hinge cavity while being applied with a certain tension. The covers 28 prevent the molding resins from entering into the spaces left around the connectors 35.

Next, the mold part 25 is clamped on the stationary mold part 20 (FIG. 9). The first resin for forming the frames and the second resin for forming the hinge portion are simultaneously injected through the injection ports 23 and 24, respectively. The first resin passes through the runners 29 formed in the movable mold part 25 and fills the cavities 33 and 36 through the gates 30. The second resin passes through the runner 31 formed in the movable mold part 25 and fills the hinge cavity 34 through the gate 32.

The first resin and the second resin are caused to flow in the same direction (a longitudinal direction of the hinge portion, i.e., a direction perpendicular to the plane of the drawing in FIG. 9 or 10) so that boundaries between the pair of frames 6 and the hinge portion 7 are positioned at predetermined positions along the ends of the frames 6. The sizes of the runners 29 and 31 and the gates 30 and 32 are adjusted so that the first and second resins pass the boundaries between the frames 6 and the hinge portion 7 simultaneously. The first resin for forming the frames 6 and the second resin for forming the hinge portion 7 are thereby combined with each other in a molten state at the boundaries and are then set. The strength of bonding therebetween is therefore large. Also, the flexible resin for forming the hinge portion does not flow into the cavities for forming the frames which are required to have a high rigidity.

It will be understood that a hinge portion 7 such as that shown in FIG. 6 can be molded by replacing the wiring members 8 shown in FIG. 10 with metal pieces 12, placing the metal pieces 12 on the spacers 28a and fixing the metal pieces 12 with the covers 28.

What is claimed is:

1. A case for housing an electric apparatus, formed by plastic molding, said case comprising:
   a hinge portion formed of a soft resin having a resiliency;
   two main portions each formed of a hard resin and integrally extending from said hinge portion; and
   a wiring member embedded in said hinge portion to provide an electrical connection path between said two main portions.

2. A case according to claim 1, wherein said wiring member is more specifically embedded and encased in said soft resin of said hinge portion such that said wiring member passes through a center of rotation of said hinge portion.

3. A case according to claim 1, wherein a through hole is formed in said hinge portion to provide a communication between cavities formed in said two main portions, and said wiring member for said electrical connection path between said two main portions is provided in said through hole.

4. A case according to claim 3, wherein printed circuit boards on which electronic parts are mounted are fixed in the cavities of said two main portions, and connectors are respectively provided on said printed circuit boards, and wherein said wiring member connects said connectors.

5. A case for housing an electric apparatus, formed by plastic molding, said case comprising:
   a hinge portion formed of a soft resin having a resiliency;
   two main portions each formed of a hard resin and integrally extending from said hinge portion;
   a wiring member embedded in said hinge portion to provide an electrical connection path between said two main portions;
   wherein said hinge portion and said main portions are formed of resins in a same family, and said resins having different hardnesses and are fused at boundaries between said hinge portion and said main portions to form regions having an intermediate hardness from hardnesses of said hinge portion and said main portions.

6. A case for housing an electric apparatus, formed by plastic molding, said case comprising:

a hinge portion formed of a soft resin having a resiliency:

two main portions each formed of a hard resin and integrally extending from said hinge portion;

a wiring member embedded in said hinge portion to provide an electrical connection path between said two main portions wherein said hinge portion and said main portions are formed of resins in different families, and said resins having different hardnesses and are fused at boundaries between said hinge portion and said main portions to form regions having an intermediate hardness from hardnesses of said hinge portion and said main portions.

* * * * *